(12) United States Patent
Takeda et al.

(10) Patent No.: US 8,586,391 B2
(45) Date of Patent: Nov. 19, 2013

(54) METHOD OF MANUFACTURING LIGHT-EMITTING DEVICE

(75) Inventors: Shigeo Takeda, Kiyosu (JP); Makoto Ishida, Kiyosu (JP); Mitsushi Terakami, Kiyosu (JP); Shota Yamamori, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/489,866

(22) Filed: Jun. 6, 2012

(65) Prior Publication Data

US 2013/0017631 A1   Jan. 17, 2013

(30) Foreign Application Priority Data

Jul. 14, 2011   (JP) ................................ 2011-155622

(51) Int. Cl.
*H01L 33/48*   (2010.01)

(52) U.S. Cl.
USPC ................ 438/26; 438/33; 257/E33.059

(58) Field of Classification Search
None
See application file for complete search history.

(56) References Cited

U.S. PATENT DOCUMENTS

| 2009/0166657 A1 | 7/2009 | Yamada et al. |
| 2012/0007112 A1 | 1/2012 | Yamada et al. |

FOREIGN PATENT DOCUMENTS

| JP | 2009-182307 A | 8/2009 |
| JP | 2010-177329 A | 8/2010 |

*Primary Examiner* — Seahvosh Nikmanesh
(74) *Attorney, Agent, or Firm* — McGinn IP Law Group, PLLC

(57) ABSTRACT

A method of manufacturing a light-emitting device includes providing a plate-shaped substrate, forming a lattice frame on a light-emitting element mounting surface of the plate-shaped substrate, mounting a light-emitting device in an opening of the lattice frame on the light-emitting element mounting surface, sealing the light-emitting element by supplying a sealing material into the opening of the lattice frame, and cutting the lattice frame and the plate-shaped substrate so as to split the lattice flame to obtain a plurality of light-emitting devices with a sidewall.

8 Claims, 7 Drawing Sheets

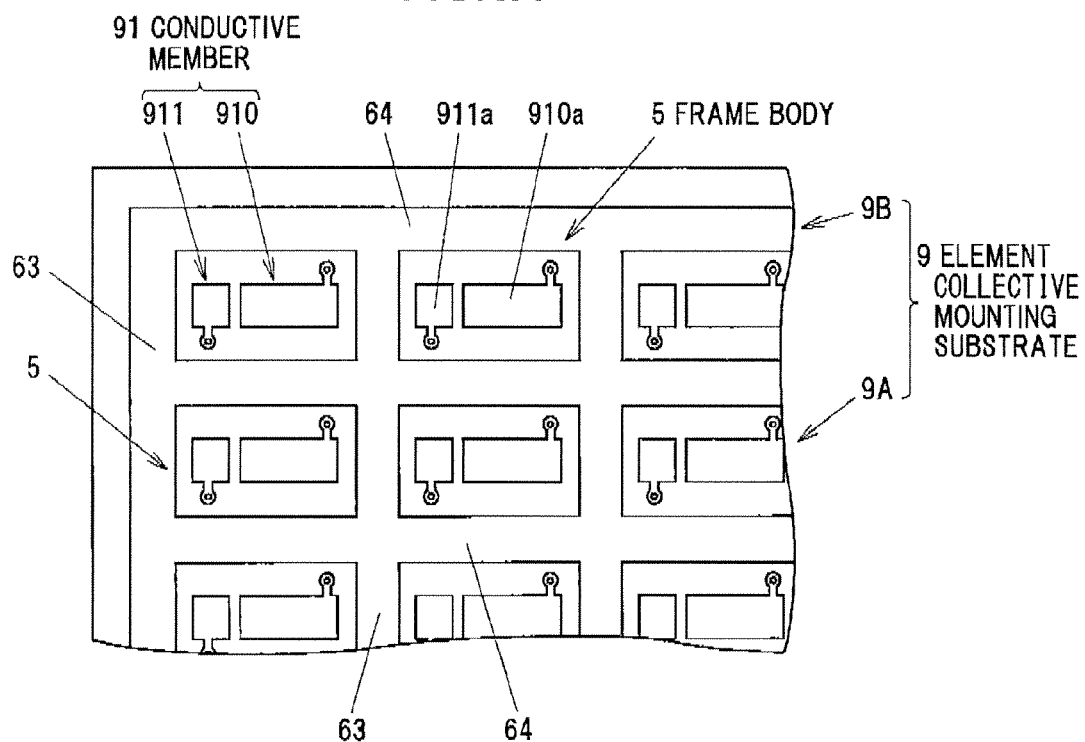
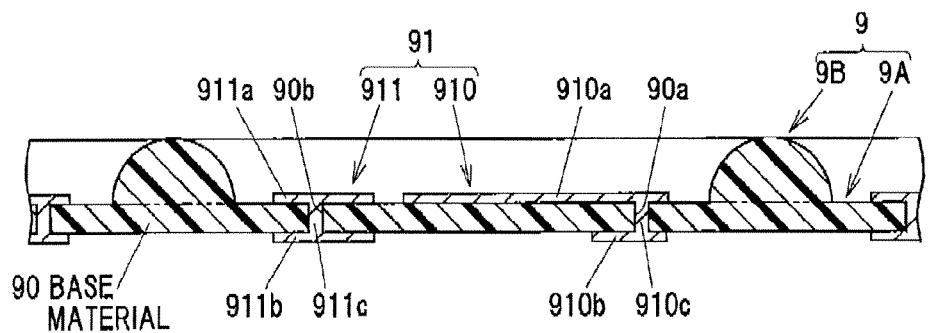

METHOD OF MANUFACTURING LIGHT-EMITTING DEVICE

The present application is based on Japanese patent application No. 2011-155622 filed on Jul. 14, 2011, the entire contents of which are incorporated herein by reference.

BACKGROUND OF THE INVENTION

1. Field of the Invention

The invention relates to a method of manufacturing a light-emitting device to obtain plural light-emitting devices by mounting and sealing plural light-emitting elements on an element collective mounting substrate and subsequently dividing the element collective mounting substrate and a frame assembly so as to each include at least one light-emitting element.

2. Related Art

A conventional light-emitting device is provided with an element mounting substrate having an element mounting portion, a light emitting diode (LED) element as a light-emitting element mounted on the element mounting portion of the element mounting substrate, and a sealing material for sealing the LED element.

For manufacturing such a light-emitting device, for example, a lead frame having plural element mounting portions insulated from each other and plural pairs of wire connecting portions is used as an element collective mounting substrate (see JP-A-2010-177329).

In other words, in the method of manufacturing a light-emitting device using a lead frame, light-emitting elements are mounted on the plural element mounting portions of the lead frame and are then connected to the plural pairs of wire connecting portions by wires, and after the light-emitting elements and the wires are sealed together with a sealing material, the sealing material and the lead frame are divided. In this case, for sealing the light-emitting elements and the wires with the sealing material, the lead frame with the elements mounted and the wires connected is placed in a mold and an uncured resin to be a sealing material is subsequently injected and solidified in a cavity of the mold.

SUMMARY OF THE INVENTION

However, the method of manufacturing a light-emitting device using a lead frame disclosed in JP-A-2010-177329 cannot realize the high-density mounting of light-emitting elements on element mounting portions and also requires a large-scale facility using a mold, which impedes cost reduction.

In the method disclosed in JP-A-2010-177329, a reflector is not formed and it is not possible to obtain a light-emitting device having desired light distribution characteristics.

Accordingly, it is an object of the invention to provide a method of manufacturing a light-emitting device that it is possible to avoid impediment to cost reduction and also to obtain a light-emitting device having desired light distribution characteristics.

(1) According to one embodiment of the invention, a method of manufacturing a light-emitting device comprises:
   providing a plate-shaped substrate;
   forming a lattice frame on a light-emitting element mounting surface of the plate-shaped substrate;
   mounting a light-emitting device in an opening of the lattice frame on the light-emitting element mounting surface;
   sealing the light-emitting element by supplying a sealing material into the opening of the lattice frame; and
   cutting the lattice frame and the plate-shaped substrate so as to split the lattice flame to obtain a plurality of light-emitting devices with a sidewall.

In the above embodiment (1) of the invention, the following modifications and changes can be made.

(i) The forming of the lattice frame is conducted such that an uncured resin is applied on the light-emitting element mounting surface by a dispenser and then cured.

(ii) The forming of the lattice frame is conducted such that at least one of a vertical frame and a horizontal frame of the lattice frame is not formed at an intersection between the vertical frame and the horizontal frame so as to prevent an uncured resin from being doubly applied to the intersection.

(iii) The forming of the lattice frame is conducted such that both of the vertical frame and the horizontal frame of the lattice frame are not formed at the intersection between the vertical frame and the horizontal frame so as to prevent an uncured resin from being doubly applied to the intersection.

(iv) The lattice frame and the sealing material comprise a resin and are simultaneously cured.

POINTS OF THE INVENTION

According to one embodiment of the invention, a method of manufacturing a light-emitting device is conducted such that a lattice frame is formed by dispensing a resin on a light-emitting element mounting surface of a plate-shaped substrate and a sealing material is then filled in an opening defined by the lattice frame (i.e., a region surrounding by the lattice frame in a plan view) to seal a light-emitting element mounted on the surface without using a mold as used in JP-A-2010-177329. Thereby, the high-density mounting of light-emitting elements can be attained without using a large-scale facility such as a mold. Therefore, the manufacturing cost can be significantly reduced.

BRIEF DESCRIPTION OF THE DRAWINGS

Next, the present invention will be explained in more detail in conjunction with appended drawings, wherein:

FIGS. 3A and 3B are explanatory diagrams illustrating collective mounting substrate in the first embodiment of the invention, wherein FIG. 3A is a plan view and FIG. 3B is a cross sectional view;

FIGS. 4A and 4B are plan views for explaining examples of forming a frame assembly on the element collective mounting substrate in the first embodiment of the invention, wherein FIG. 4A shows the present example and FIG. 4B shows another example;

FIGS. 5A to 5E are cross sectional views for explaining a method of manufacturing a light-emitting device using the element collective mounting substrate in the first embodiment of the invention, wherein FIG. 5A shows a plating step, FIG. 5B shows an LED element mounting step, FIG. 5C shows a wire-bonding step, FIG. 5D shows a sealing step and FIG. 5E shows a dicing step;

FIGS. 6A and FIG. 6B are explanatory diagrams illustrating an element collective mounting substrate in a second embodiment of the invention, wherein FIG. 6A is a plan view and FIG. 6B is a cross sectional view; and FIGS. 7A to 7D are cross sectional views for explaining a method of manufacturing a light-emitting device using the element collective mounting substrate in the second embodiment of the invention, wherein FIG. 7A shows an LED element mounting step, FIG. 7B shows a wire-bonding step, FIG. 7C shows a sealing step and FIG. 7D shows a dicing step.

DESCRIPTION OF THE PREFERRED EMBODIMENTS

First Embodiment

A method of manufacturing a light-emitting device manufactured using an element collective mounting substrate in a first embodiment of the invention will be described in detail in reference to the drawings.

Overall Structure of Light-Emitting Device

Figure 1:
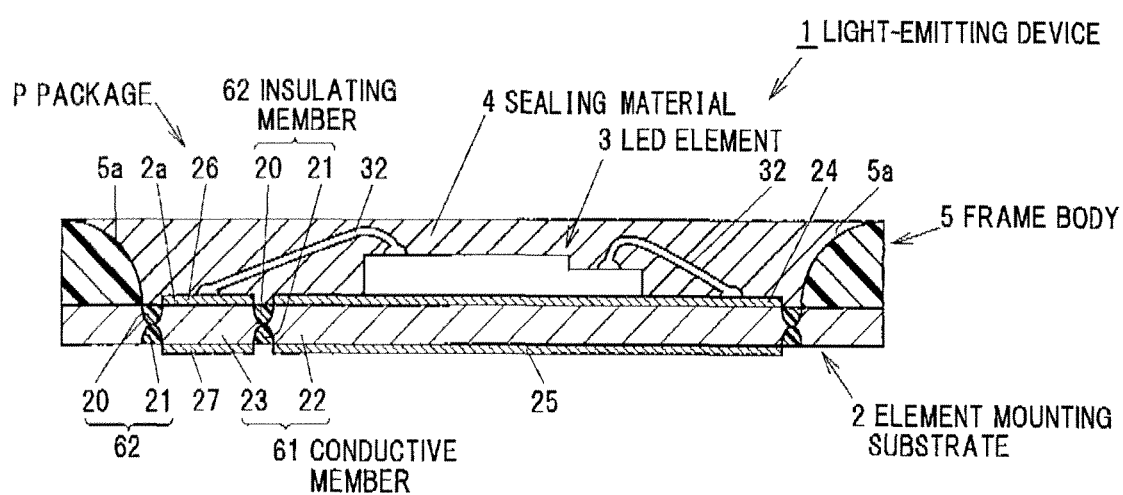
FIG. 1 is a cross sectional view showing a light-emitting device manufactured using an element collective mounting substrate in a first embodiment of the present invention.

FIG. 1 shows a light-emitting device. As shown in FIG. 1, a light-emitting device 1 is generally composed of an element mounting substrate 2, an LED element 3 mounted on the element mounting substrate 2, a sealing material 4 for sealing the LED element 3, and a frame body 5 forming a package P together with the sealing material 4 and the element mounting substrate 2.

Structure of Element Mounting Substrate 2

The element mounting substrate 2, which is a part of an element collective mounting substrate 6 (shown in FIG. 3) used for manufacturing the light-emitting device 1, has a pair of contact pads 22, 23 as a conductive member which are insulated from each other by a first insulating member 20 and a second insulating member 21, and the entire element mounting substrate 2 is formed of a plate member having a rectangular shape in a plan view. Thickness of the element mounting substrate 2 is set to about 1.0 mm. The element collective mounting substrate 6 will be described in detail later.

The first insulating member 20 is arranged on one side (element mounting side) of the element mounting substrate 2 and the second insulating member 21 is arranged on another side (element non-mounting side) of the element mounting substrate 2. Resins such as thermoplastic resin, e.g., polyamide, etc., or thermoset resin, e.g., epoxy resin or silicone resin, etc., containing white pigment such as titanium oxide which blocks light, or ceramics such as alumina, etc., are used as a material of the first insulating member 20 and the second insulating member 21. A silicone resin is used in the present embodiment.

The pair of contact pads 22, 23 is arranged so as to be adjacent to each other via the first insulating member 20 and the second insulating member 21 and in parallel to each other in a surface direction of the element mounting substrate 2. The contact pad 22 is an element mounting/wire connecting pad (for mounting element and also connecting wire) while the contact pad 23 is a wire connecting pad.

On front and back surfaces of the contact pad 22, plated portions 24 and 25 are provided by plating, e.g., silver (Ag), etc. On front and back surfaces of the contact pad 23, plated portions 26 and 27 are provided by plating, e.g., Ag, etc., in the same manner as the contact pad 22. Metals made of e.g., copper alloy or iron alloy are used as a material of the pair of contact pads 22, 23.

Structure of LED Element 3

Figure 2:
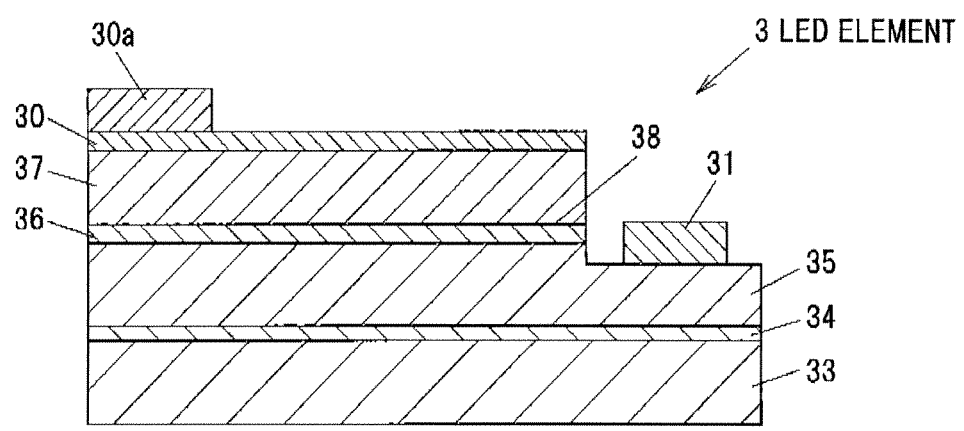
FIG. 2 is a cross sectional view showing an LED element of the light-emitting device manufactured using the element collective mounting substrate in the first embodiment of the invention.

FIG. 2 shows an LED element. As shown in FIG. 2, the LED element 3 has a p-side electrode 30 and an n-side electrode 31, and is mounted at substantially the center of an element mounting surface 2a (shown in FIG. 1) of the element mounting substrate 2 by respectively connecting the p-side electrode 30 (a p-side pad electrode 30a) to the plated portion 26 and the n-side electrode 31 to the plated portion 24 using wires 32 (shown in FIG. 1). As the LED element 3, for example, a blue LED element having a substantially square shape in a plan view is used.

In addition, the LED element 3 has a buffer layer 34, an n-type semiconductor layer 35 a MQW (Multiple Quantum Well) layer 36 as a light-emitting layer and a p-type semiconductor layer 37 formed in this order by epitaxially growing a group III nitride-based semiconductor on a surface of a sapphire ($Al_2O_3$) substrate 33 at, e.g., a temperature of 700° C., and is configured so that blue light having a peak emission wavelength of, e.g., 435 nm to 480 nm is emitted from a light-emitting face 38.

The p-side electrode 30 has the p-side pad electrode 30a and is provided on a surface of the p-type semiconductor layer 37. The n-side electrode 31 is provided on a portion (of the n-type semiconductor layer 35) exposed by partially etching from the p-type semiconductor layer 37, the MQW layer 36 to the n-type semiconductor layer 35. A transparent conductive member made of oxide such as, e.g., ITO (Indium Tin Oxide) is used as a material of the p-side electrode 30 and a metal such as, e.g., Ni/Au or Al is used as a material of the p-side pad electrode 30a and the n-side electrode 31.

Structure of Sealing Material 4

The sealing material 4 is placed inside the frame body 5 and is formed entirely of, e.g., a silicone-based light transmitting resin (thermoset resin). In addition, the sealing material 4 is configured to seal the LED element 3 and the wires 32 on the element mounting substrate 2. As a material of the sealing material 4, it is possible to use light transmitting resins such as epoxy resin, modified epoxy resin, silicone resin, modified silicone resin and fluorine resin, etc. The sealing material 4 may contain a phosphor which is excited by receiving blue light emitted from the LED element 3 and thereby emits yellow light. In this case, it is possible to obtain white light as a mixture of the blue light emitted from the LED element and the yellow light emitted from the phosphor excited by the blue light.

Structure of Frame Body 5

The frame body 5 is formed of e.g., a silicone resin such that a sidewall surface 5a located inner side of the package P is an upwardly convex curved surface in a cross section. The frame body 5 surrounds an outer rim of the element mounting surface 2a having a rectangular shape in a plan view so that an opening therein is enlarged from an element mounting-side opening toward a light extraction-side opening. In addition, the frame body 5 is configured to reflect light from the LED element 3 so that the light is extracted to the outside of the package P.

Structure of Element Collective Mounting Substrate 6

Figure 3A:
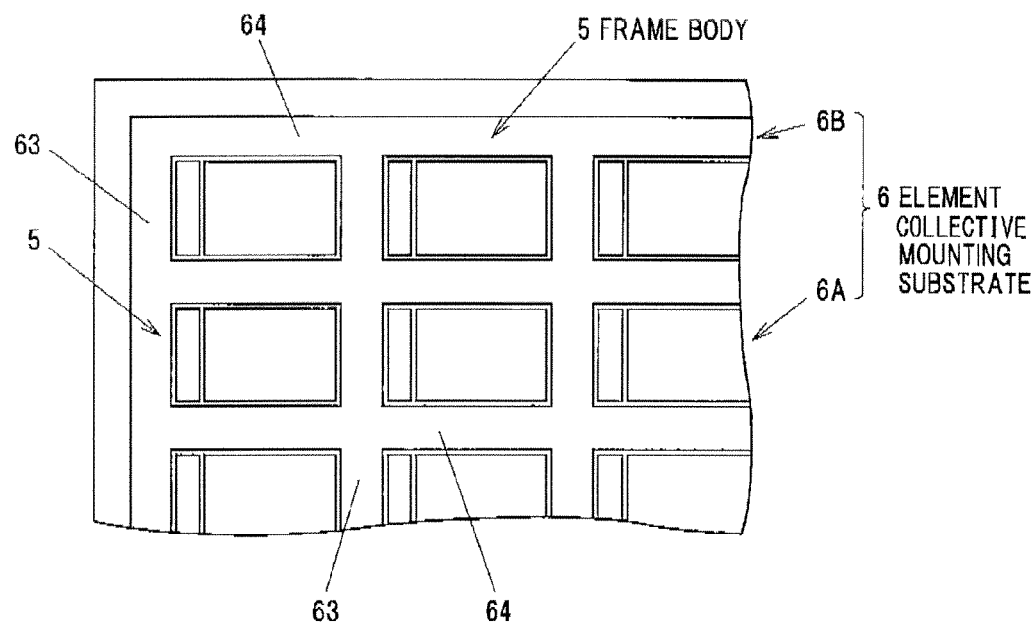
Figure 3B:
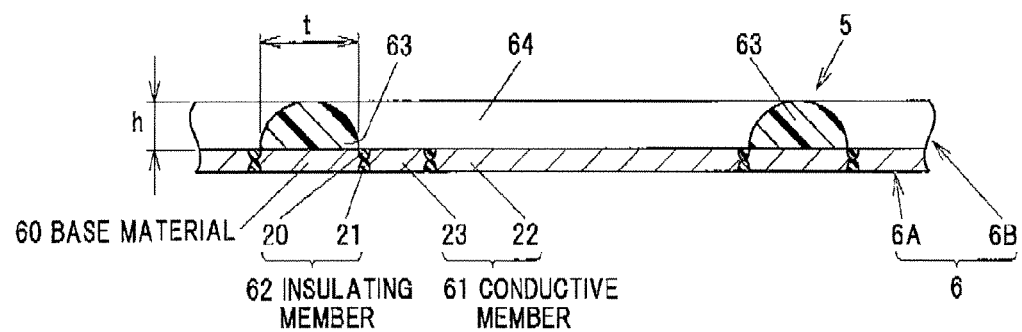

Next, the element collective mounting substrate 6 will be explained using FIGS. 3A and 3B. FIGS. 3A and 3B show an element collective mounting substrate. As shown in FIGS. 3A and 3B, the entire element collective mounting substrate 6 is composed of a plate-shaped substrate material 6A having a rectangular shape in a plan view and a frame assembly 6B, and is a composite member including plural frame bodies 5.

The substrate material 6A has a base material 60, a conductive member 61 and an insulating member 62, is arranged on one side of the element collective mounting substrate 6, and is formed entirely of a plate member having a rectangular shape in a plan view. A "resin composite lead frame" described in JP-A-2010-177329 is used as the substrate material 6A. For forming the substrate material 6A, a first recessed portion is formed on a metal plate (copper alloy or iron alloy) by etching a front surface thereof, the first insulating member 20 is filled in the first recessed portion by screen printing, and subsequently, a second recessed portion is formed on the metal plate by etching a back surface thereof and the second insulating member 21 is filled in the second recessed portion by screen printing.

The base material 60 as a part of the metal plate is arranged on an element mounting side of the frame assembly 6B and is formed entirely of a lattice-shaped member. In addition, the base material 60 is configured to have the frame assembly 6B formed on the element mounting side thereof.

The conductive member 61 is composed of a pair of contact pads 22 23 which are a part of the metal plate in the same manner as the base material 60, and plural pairs (e.g., 14 pairs in a vertical direction and 15 pairs in a horizontal direction) are arranged vertically and horizontally in parallel in a plan view on the element mounting side of the base material 60. In addition, it is configured that, of two openings of the frame assembly 6B which open on two sides in a direction intersecting with (in the present embodiment, orthogonal to) a surface of the base material 60 on the element mounting side, an opening on the base material 60 side is partially blocked by the conductive member 61. The contact pads 22 and 23 in each pair are insulated from each other by the first insulating member 20 and the second insulating member 21.

The insulating member 62 is composed of the first insulating member 20 and the second insulating member 21 which are arranged in a line in a thickness direction of the element collective mounting substrate 6. In addition, the insulating member 62 is configured to partition the contact pads 22 and 23 in each of the plural pairs.

The frame assembly 6B is formed by assembling plural frame bodies 5. The frame bodies 5 are coupled to each other in a lattice shape so that each opening is enlarged from the element mounting-side opening toward the light extraction-side opening. As a result, the element collective mounting substrate 6 functions as a member including plural frame bodies 5, and it is thereby possible to inject an uncured resin to be the sealing material 4 into each frame body 5 at the time of manufacturing the light-emitting device 1. Light transmitting resins such as epoxy resin, modified epoxy resin, silicone resin, modified silicone resin and fluorine resin, etc., in which white pigment such as titanium oxide is contained to impart light reflectivity are used as a material of the frame assembly 6B and it is preferable to use the same material as the insulating member 62 (silicone resin) from the viewpoint of adhesion with the element collective mounting substrate 6.

Figure 4A:
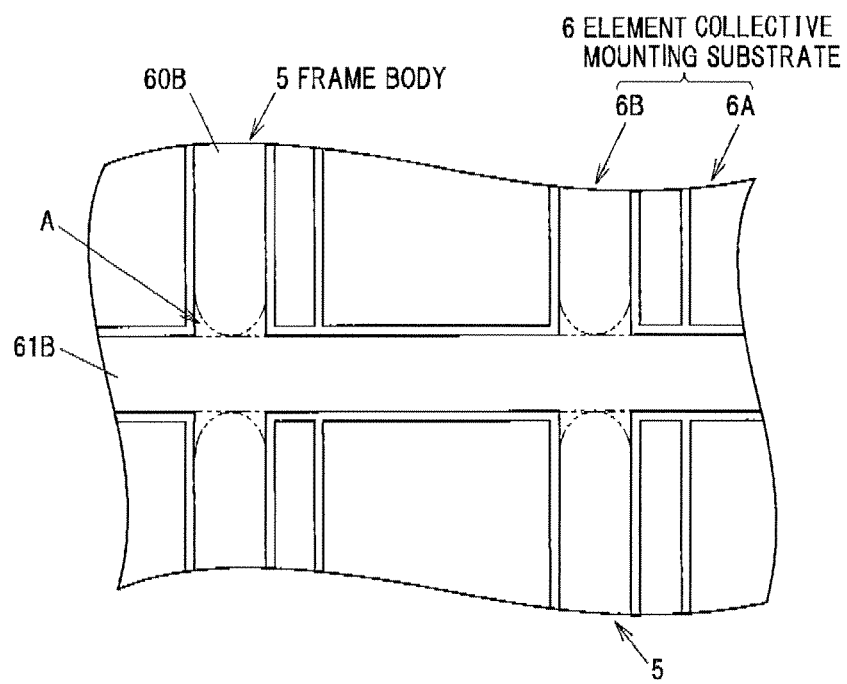

For forming the frame assembly 6B, uncured resins 60B and 61B (the uncured resin 60B in a vertical direction and the uncured resin 61B in a horizontal direction) are applied in a lattice shape by a dispenser on a surface of the substrate material 6A (the base material 60) on the element mounting side so that the vertical uncured resin 60B buts against the horizontal uncured resin 61B without overlapping in a thickness direction of the substrate material 6A at a portion A as a corner of the frame body 5 indicated by a chain double-dashed line in FIG. 4A. After the vertical uncured resin 60B and the horizontal uncured resin 61B are cured, a gap at the corner A is filled with a resin as indicated by a solid line in FIG. 4A, plural openings having a rectangular shape in a plan view are formed on the surface of the substrate material 6A on the element mounting side by vertical frames 63 and horizontal frames 64 respectively arranged in parallel when viewed in plan, and the frame assembly 6B of which thickness is substantially uniform in the intersection and in other portions is thereby obtained.

Figure 4B:
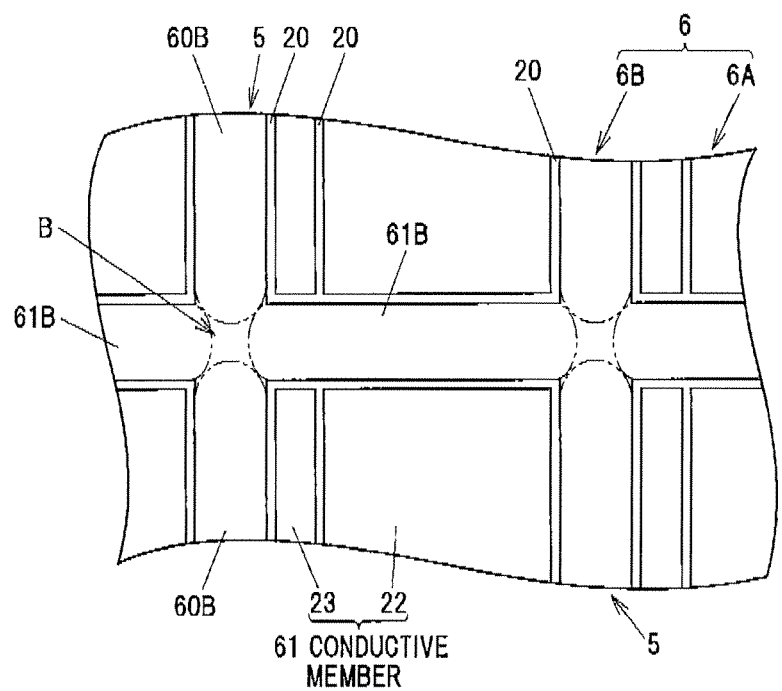

Although it has been explained that the case where the frame assembly 6B in the present embodiment is formed by the method as explained using a chain double-dashed line in FIG. 4A so as not to overlap the uncured resins, the invention is not limited thereto and a method of formation as shown in FIG. 4B may be used. In this case, the vertical uncured resins 60B and the horizontal uncured resins 61B are applied by a dispenser on the surface of the substrate material 6A (the base material 60) on the element mounting side so as to respectively butt against each other at a portion B as a corner of the frame body 5. The frame assembly 6B of which thickness is substantially uniform in the intersection and in other portions is obtained also in this case.

Method of Manufacturing Light-Emitting Device 1

Next, a method of manufacturing the light-emitting device 1 in the present embodiment will be described in reference to FIGS. 5A to 5E. FIGS. 5A to 5E show a manufacturing procedure of a light-emitting device.

In the method of manufacturing a light-emitting device in the present embodiment, steps of "plating process", "LED element mounting", "wire bonding", "LED element sealing" and "dicing" are sequentially performed, and accordingly, each step is sequentially explained.

Plating Process

Figure 5A:
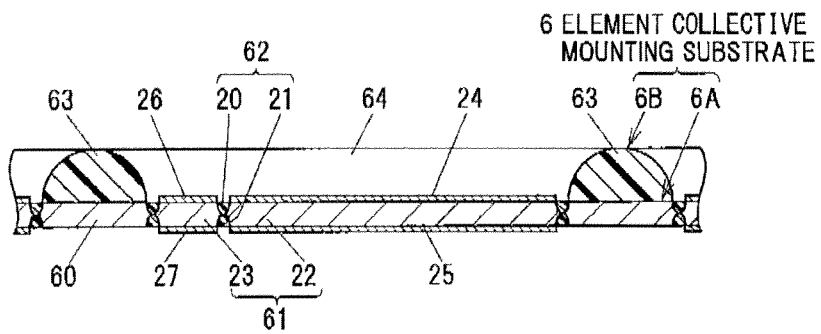

As shown in FIG. 5A, the plated portions 24 and 25 are formed by performing a plating process on the front and back surfaces of the contact pad 22 of the element collective mounting substrate 6. Likewise, the plated portions 26 and 27 are formed by performing a plating process on the front and back surfaces of the contact pad 23 of the element collective mounting substrate 6.

LED Element Mounting

Figure 5B:
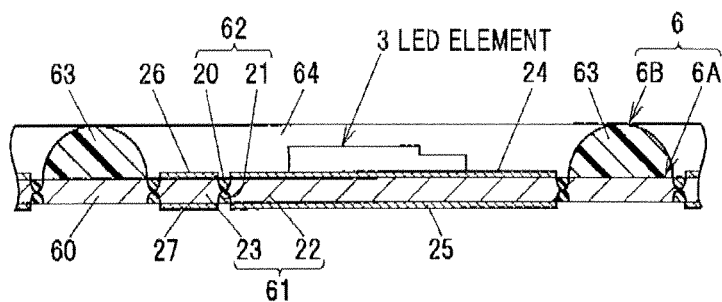

As shown in FIG. 5B, the LED element 3 is bonded to the contact pad 22 of the element collective mounting substrate 6 via the plated portion 24 using, e.g., an insulating adhesive (not shown) such as epoxy resin. At this time, the LED element 3 is bonded so that the p-side pad electrode 30a and the n-side electrode 31 (both shown in FIG. 2) face toward the light extraction side thereof (so-called face-up mounting). As a result, plural LED elements 3 (in the present embodiment, two hundred and ten LED elements in total=14 in a vertical direction multiplied by 15 in a horizontal direction) are mounted on the element collective mounting substrate 6.

Wire Bonding

Figure 5C:
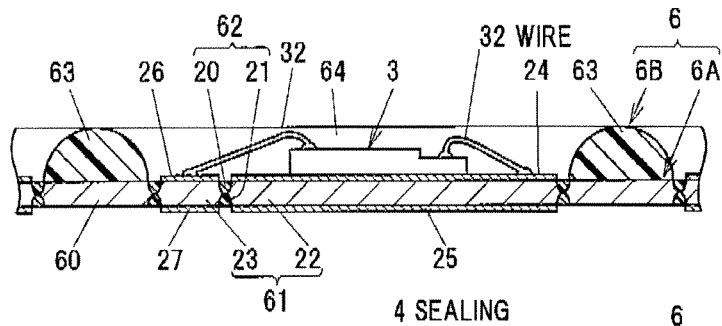

As shown in FIG. 5C, the LED element 3 is connected to the plated portion 24 on the contact pad 22 and to the plated portion 26 on the contact pad 23 by the wires 32 using, e.g., a conductive adhesive containing silver powder. In this case, respectively via the wires 32, the p-side pad electrode 30a is connected to the plated portion 26 and the n-side electrode 31 is connected to the plated portion 24.

LED Element Sealing

Figure 5D:
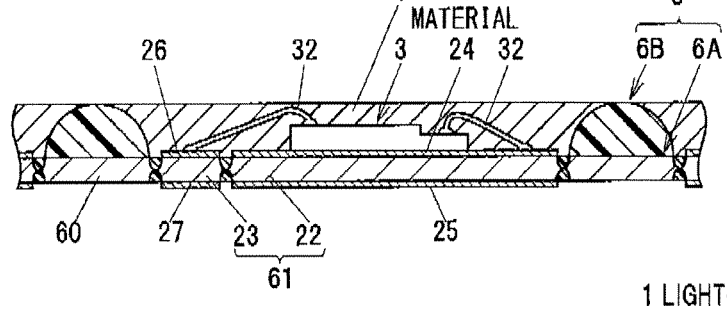

As shown in FIG. 5D, an uncured silicone resin to be the sealing material 4 is injected into openings partitioned by the frame assembly 6B of the element collective mounting substrate 6 using, e.g., a dispenser (not shown) and is then solidified. As a result, the plural LED elements 3 on the element collective mounting substrate 6, together with the wires 32, are sealed with the sealing material 4.

Dicing

Figure 5E:
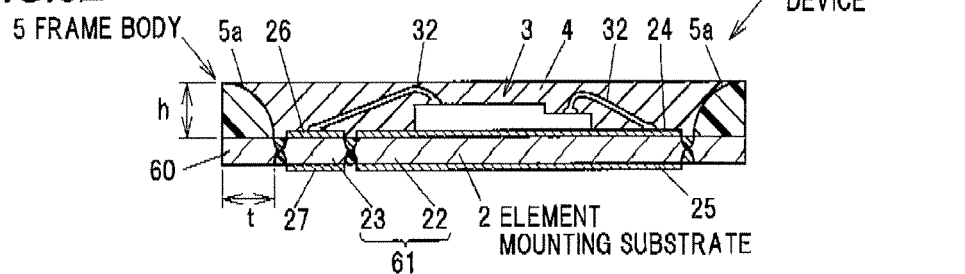

As shown in FIG. 5E, each of the vertical frames 63 and each of the horizontal frames 64 are cut along the center lines thereof by using, e.g., a rotating dicing blade (not shown) so as to be equally separated, thereby dividing the base material 60 so that each piece is composed of the LED element 3, the contact pads 22, 23 and the frame body 5. As a result, plural (two hundred and ten in total) light-emitting devices 1 (only one light-emitting device 1 is shown in FIG. 5E) each having the LED element 3 sealed together with the wires 32 by the sealing material 4 on the element mounting substrate 2 having the frame body 5 are obtained.

Effects of the First Embodiment

The following effects are obtained by the first embodiment described above.

(1) Since it is possible to realize high-density mounting of the LED elements 3 on the element collective mounting substrate 6, a large-scale facility which is conventionally required is unnecessary and it is thus possible to avoid impediment to cost reduction.

(2) Since the sidewall surface 5a of the frame body 5 is a reflector, it is possible to obtain the light-emitting device 1 having desired light distribution characteristics.

Second Embodiment

Next, an element collective mounting substrate and a method of manufacturing a light-emitting device using thereof in a second embodiment of the invention will be described using FIGS. 6A and 6B. FIGS. 6A and 6B show an element collective mounting substrate. In FIGS. 6A and 6B, members which are the same as or equivalent to those in FIGS. 1 to 3B are denoted by the same reference numerals and the explanations thereof will be omitted.

As shown in FIGS. 6A and 6B, an element collective mounting substrate 9 in the second embodiment of the invention is characterized in that a base material 90 is formed of an insulating member.

Accordingly, the element collective mounting substrate 9 is composed of a substrate material 9A and a frame assembly 9B each using an insulation material as a base, and is formed entirely of a lattice-shaped composite member to be plural frame bodies 5.

The substrate material 9A has a base material 90 and a conductive member 91, and is formed entirely of a planar plate member having a rectangular shape in a plane view.

The base material 90 is formed by laminating a ceramic sheet of, e.g. aluminum oxide ($Al_2O_3$) as an insulating member. Ceramics such as aluminum nitride (AlN) may be used as a material of the base material 90.

The conductive member 91 is composed of a pair of conductor patterns 910, 911, and plural pairs (e.g., 14 pairs in a vertical direction and 15 pairs in a horizontal direction) insulated from each other by the base material 90 are arranged on the substrate material 9A. The pairs of conductor patterns 910, 911 are arranged vertically and horizontally in parallel in a plan view on the base material 90. In addition, it is configured that, of two openings of the frame assembly 9B which open on two sides in a direction intersecting with (in the present embodiment, orthogonal to) a surface of the base material 90 on the element mounting side, an opening on the base material 90 side is partially blocked by the conductive member 91.

The conductor pattern 910 functions as an element mounting/wire connecting pad (for mounting element and also connecting wire), and is composed of a front surface pattern 910a to be connected to the n-side electrode 31 (shown in FIG. 2) of the LED element 3, a back surface pattern 910b for supplying power-supply voltage to the LED element 3 (shown in FIG. 1), and a via pattern 910c filled in a via hole 90a penetrating through the base material 90 to connect the front surface pattern 910a to the back surface pattern 910b.

Meanwhile, the conductor pattern 911 functions as a wire connecting pad and is composed of a front surface pattern 911a to be connected to the p-side pad electrode 30a (shown in FIG. 1) of the LED element 3, a back surface pattern 911b for supplying power-supply voltage to the LED element 3 (shown in FIG. 1), and a via pattern 911c filled in a via hole 90b penetrating through the base material 90 to connect the front surface pattern 911a to the back surface pattern 911b.

Refractory metal such as, e.g., tungsten (W) or molybdenum (Mo) is each used for integrally forming the front and back surface patterns 910a, 910b with the via pattern 910c and the front and back surface patterns 911a, 911b with the via pattern 911c.

A single or plural metal layers formed of a material such as nickel (Ni), aluminum (Al), platinum (Pt), titanium (Ti), gold (Au), silver (Ag) and copper (Co) are formed on surfaces of the front surface patterns 910a, 911a and the back surface patterns 910b, 911b appropriate.

Since the frame assembly 913 is formed by applying an uncured resin using a dispenser and is subsequently cured in the same manner as the first embodiment, the detailed explanation thereof will be omitted here.

Method of Manufacturing Light-Emitting Device 1

Next, a method of manufacturing the light-emitting device 1 using the element collective mounting substrate 9 in the present embodiment will be described in reference to FIGS. 7A to 7D. FIGS. 7A to 7D show a manufacturing procedure of a light-emitting device.

In the method of manufacturing a light-emitting device in the present embodiment, steps of "LED element mounting", "wire bonding", "LED element sealing" and "dicing" are sequentially performed. and accordingly, each step is sequentially explained.

LED Element Mounting

Figure 7A:
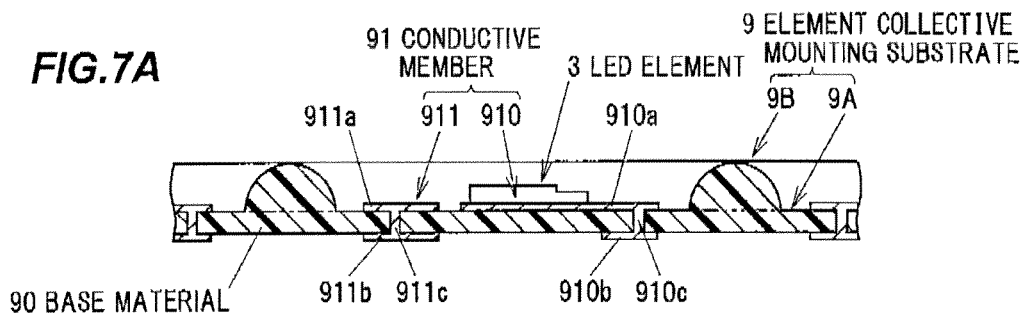

As shown in FIG. 7A, the LED element 3 is bonded to the front surface pattern 910a of the element collective mounting substrate 9 using, e.g., a conductive adhesive (not shown) containing silver powder. At this time, the LED element 3 is bonded so that the p-side pad electrode 30a and the n-side electrode 31 (both shown in FIG. 2) face toward the light extraction side thereof. As a result, plural LED elements 3 (in the present embodiment, two hundred and ten LED elements in total=14 in a vertical direction multiplied by 15 in a horizontal direction) are mounted on the element collective mounting substrate 9.

Wire Bonding

Figure 7B:
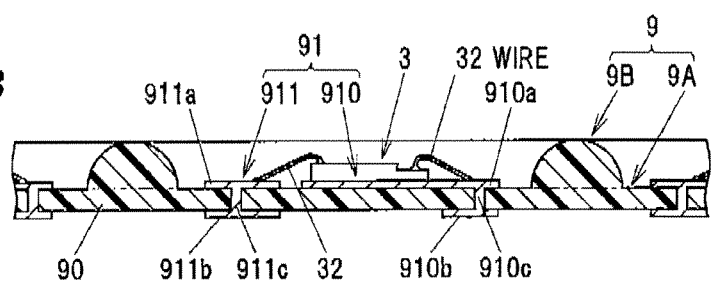

As shown in FIG. 7B, the LED element 3 is connected to the front surface pattern 910a on the conductor pattern 910 and to the front surface pattern 911a on the conductor pattern 911 by the wires 32 using, e.g., a conductive adhesive containing silver powder. In this case, respectively via the wires 32, the p-side pad electrode 30a is connected to the front surface pattern 911a and the n-side electrode 31 is connected to the front surface pattern 910a.

LED Element Sealing

Figure 7C:
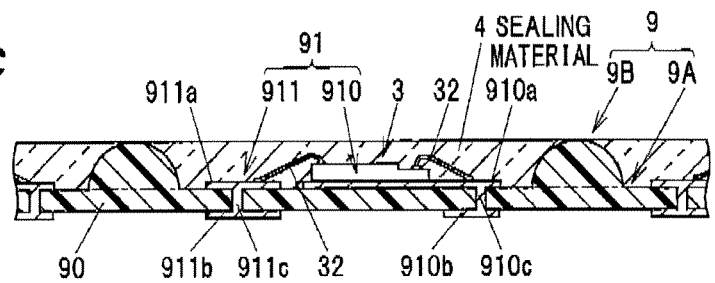

As shown in FIG. 7C, an uncured silicone resin to be the sealing material 4 is injected into openings partitioned by the frame assembly 913 of element collective mounting substrate 9 using, e.g., a dispenser (not show) and is then solidified. As a result, the plural LED elements 3 on the element collective mounting substrate 9, together with the wires 32, are sealed with the sealing material 4.

Dicing

Figure 7D:
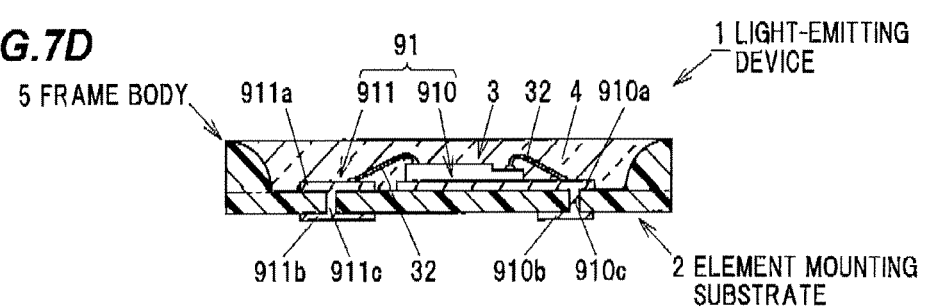

As shown in FIG. 7D, each of the vertical frames 63 and each of the horizontal frames 64 are cut along the center lines thereof by using, e.g., a rotating dicing blade (not shown) so as to be equally separated, thereby dividing the base material 90 and the frame assembly 9B so that each piece is composed of the LED element 3, the conductor patterns 910, 911 and the frame body 5. As a result, plural (two hundred and ten in total) light-emitting devices 1 (only one light-emitting device 1 is shown in FIG. 7D) each having the LED element 3 sealed together with the wires 32 by the sealing material 4 on the element mounting substrate 2 having the frame body 5 are obtained.

Effects of the Second Embodiment

In the second embodiment described above, the following effects are obtained in addition to the effects of the first embodiment.

Since the element collective mounting substrate 9 on which a circuit pattern (the front surface patterns 910*a*, 911*a*, the back surface patterns 910*b*, 911*b* and the via patterns 910*c*, 911*c*) is preliminarily formed is used for manufacturing the light-emitting device 1, it is possible to reduce the number of manufacturing steps and the manufacturing cost thus can be low.

Although the element collective mounting substrate and the method of manufacturing a light-emitting device of the invention have been described based on the embodiments, the invention is not intended to be limited thereto and the various kinds of embodiments can be implemented without departing from the gist of the invention. For example, the following modification can be made.

(1) Although an uncured resin is applied by a dispenser and is subsequently cured to form the frame assembly 6B in the embodiments, the invention is not limited thereto. The frame assembly 6B may be formed by screen printing an uncured resin followed by curing, or may be formed by compression molding or transfer molding.

(2) Although the LED element 3 is "face-up mounted" on the element collective mounting substrate 6, 9 and is connected to the contact pads 22, 23 or the conductor patterns 910, 911 by wires in the embodiments, the invention is not limited thereto. The LED element 3 may be "flip-chip mounted" and connected to the contact pads 22, 23 or the conductor patterns 910, 911 by bumps.

(3) Although one LED element 3 is mounted in the frame body 5 in the embodiments, multiple LED elements 3 may be mounted. In this case, the LED elements 3 may have substantially equal peak emission wavelengths (the same blue emission) or may have different peak wavelengths (e.g., blue and red emissions, or blue, green and red emissions).

(4) Although the division into the light-emitting devices 1 is carried out so that one unit is defined by a frame body 5 in the embodiments, the invention is not limited thereto. The division into the light-emitting devices may be carried out so that plural frame bodies are included in a unit.

(5) Although the LED element 3 is mounted on the element collective mounting substrate 2, 6 after forming the frame assembly 6B in the embodiments, the invention is not limited thereto. The frame assembly 6B may be formed after mounting the LED element 3.

(6) Although the frame assembly 6B is formed by applying and curing an uncured resin and an uncured sealing material 4 is subsequently injected and cured in the opening of the frame assembly 6B in the embodiments, the frame assembly 6B and the sealing material 4 may be simultaneously cured.

(7) Although an uncured resin is supplied to the LED element 3 by a dispenser in the embodiments, the invention is not limited thereto and the uncured resin may be applied by screen printing, etc.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method of manufacturing a light-emitting device, the method comprising:
    providing a plate-shaped substrate;
    forming a lattice frame comprising a horizontal frame and a vertical frame on a light-emitting element mounting surface of the plate-shaped substrate, the forming of the lattice frame comprising applying an uncured resin on the light-emitting element mounting surface such that a gap is formed in the uncured resin at an intersection of the horizontal frame and the vertical frame, and then curing the uncured resin;
    mounting a light-emitting device in an opening of the lattice frame on the light-emitting element mounting surface;
    sealing the light-emitting element by supplying a sealing material into the opening of the lattice frame; and
    cutting the lattice frame and the plate-shaped substrate so as to split the lattice flame to obtain a plurality of light-emitting devices with a sidewall.

2. The method according to claim 1, wherein the forming of the lattice frame is conducted such that at least one of the vertical frame and the horizontal frame of the lattice frame is not formed at the intersection between the vertical frame and the horizontal frame so as to prevent the uncured resin from being doubly applied to the intersection.

3. The method according to claim 1, wherein the forming of the lattice frame is conducted such that both of the vertical frame and the horizontal frame of the lattice frame are not formed at the intersection between the vertical frame and the horizontal frame so as to prevent an uncured resin from being doubly applied to the intersection.

4. The method according to claim 1, wherein the lattice frame and the sealing material comprise a resin and are simultaneously cured.

5. The method according to claim 3, wherein the lattice frame and the sealing material comprise a resin and are simultaneously cured.

6. The method according to claim 1, wherein, after said curing the uncured resin, the gap is filled with a resin.

7. The method according to claim 1, wherein, after forming the lattice, the gap is filled with a resin.

8. The method according to claim 7, wherein the lattice frame, the sealing material, and the resin filling the gap each comprise a resin and are simultaneously cured.

* * * * *